United States Patent [19]

Cathey et al.

[11] Patent Number: 4,859,304
[45] Date of Patent: Aug. 22, 1989

[54] TEMPERATURE CONTROLLED ANODE FOR PLASMA DRY ETCHERS FOR ETCHING SEMICONDUCTOR

[75] Inventors: David A. Cathey; John C. Freeman; James Dale; William J. Crane; Eric A. Powell; Jeffrey V. Musser, all of Boise, Id.

[73] Assignee: Micron Technology, Inc., Boise, Id.

[21] Appl. No.: 220,749

[22] Filed: Jul. 18, 1988

[51] Int. Cl.$^4$ .................. B01J 19/12; C23C 14/50
[52] U.S. Cl. .................. 204/298; 156/345; 422/186.05
[58] Field of Search ..... 204/298 E, 298 AN, 298 CS, 204/192.32; 156/345, 643; 422/186.05

[56] References Cited

U.S. PATENT DOCUMENTS

| | | | |
|---|---|---|---|
| 3,598,710 | 8/1971 | Davidse | 204/192.37 |
| 4,298,443 | 11/1981 | Maydan | 204/192.32 |
| 4,361,749 | 11/1982 | Lord | 219/121.4 |
| 4,399,016 | 8/1983 | Tsukada et al. | 156/643 |
| 4,400,235 | 8/1983 | Coquin et al. | 156/643 |
| 4,426,246 | 1/1984 | Kravitz et al. | 156/643 |
| 4,491,496 | 1/1985 | Laparte et al. | 156/345 |
| 4,579,618 | 4/1986 | Celestino et al. | 156/345 |
| 4,614,639 | 9/1986 | Hegedus | 422/186.05 |
| 4,615,755 | 10/1986 | Tracy et al. | 156/345 |
| 4,793,975 | 12/1988 | Drage | 422/186.05 |

FOREIGN PATENT DOCUMENTS

| | | | |
|---|---|---|---|
| 58-123729 | 7/1983 | Japan | 156/345 |
| 59-136930 | 8/1984 | Japan | 156/345 |
| 59-175727 | 10/1984 | Japan | 156/345 |

Primary Examiner—Aaron Weisstuch
Attorney, Agent, or Firm—Stan Protigal; Angus Fox

[57] ABSTRACT

A plasma dry etch chamber is provided with an anode plate which has a cooling jacket which extends radially outwardly from a cooling core to an extent corresponding to the radial dimension of a silicon wafer work product. In order to further reduce deposit formation, the outer perimeter of the anode is designed to reduce the effects of polymer deposition.

15 Claims, 5 Drawing Sheets

TEMPERATURE CONTROLLED ANODE FOR PLASMA DRY ETCHERS FOR ETCHING SEMICONDUCTOR

FIELD OF THE INVENTION

This invention relates to semiconductor manufacture and the control of heat transfer in anode plates used in dry etch equipment for forming dry etch processes on semiconductor wafers. The dry etch equipment is sometimes referred to as a reactor.

BACKGROUND OF THE INVENTION

Plasma dry etch machines on reactors are vacuum chambers in which an electrical plasma is created in order to etch semiconductor wafers. The etching is usually performed through a photoresist mask. Quite often it is desired to etch oxide layers preferentially over adjacent polysilicon such as the wafer substrate.

In the dry etch process, a wafer is placed over a metallic anode plate and plasma is discharged to flow from a cathode to the anode plate, where the wafer functions as the anode. This process causes the wafer to increase in temperature, usually to about 100 to 150 degrees C. The anode plate is cooled in order to cool the wafer; using cooling water, it is typically at about 20 degrees C. The cooled anode plate thereby cools the wafer. If the wafer is permitted to elevate in temperature, the reaction is adversely affected. More importantly, photoresist tends to be more stable at lower temperatures, and at higher temperatures tends to erode or change form or composition.

In the etching process, a fluoropolymer is applied to the wafer in order to cause the preferential etching of silicon dioxide over silicon. The fluoropolymer tends to deposit on the anode plate, particularly at cool portions of the anode plate.

This deposition necessitates a removal of the anode plate for cleaning after a given number of cycles, typically 100 cycles. The removal for cleaning results in equipment downtime for the plasma dry etch machine because of the difficulty in removing and replacing the anode plate. If the anode plate is maintained at a particularly cool temperature, the fluoropolymer tends to deposit more rapidly, therefore, while efficient operation of the anode plate can be achieved by operating the anode plate at higher temperatures, the wafer must be maintained at low temperatures.

Polymer buildup tends to occur around the outer perimeter of the anode outside of the area where the wafer is resting, but this buildup interferes with the etching process. The necessity to maintain the wafer at low temperatures also implies that power applied in the plasma etch process be limited. Higher power would result in a higher etch rate and better throughput, but it is necessary to restrict power in order that the surface temperature of the wafer does not exceed the temperature for deterioration of the photoresist.

For this reason, it is desired that an anode design be able to accommodate a more accurate control of temperature and a greater cooling rate. It is also desired that the anode be able to be operated for longer periods of time between cleaning processes. It is therefore desirable that the anode be able to transfer heat from a silicon wafer rapidly, while being less susceptible to polymer buildup.

SUMMARY OF THE INVENTION

In accordance with the present invention, a plasma dry etch chamber is provided with an anode plate which has a cooling jacket which extends radially outwardly from a cooling core. The cooling jacket preferentially cools the anode plate at the location of the work (a silicon wafer). The configuration reduces the effects of polymer deposition, thereby extending time between service intervals.

In one embodiment, the outer perimeter is beveled, in order that the effects of polymer buildup are reduced. Since polymer buildup tends to slow after a certain level of deposition, cycles of operation between surface removal is extended.

In another embodiment, the anode plate is constructed of two pieces, so that the anode plate includes an outer section which has a reduced ability to thermally conduct to a cooled center section.

In another embodiment of the invention, a non-metallic ring is provided in a perimeter area of the anode plate, thereby increasing the temperature of the anode plate at the perimeter area as a result of reduced heat conduction. The non-metallic portion may also have a reduced affinity toward polymer deposition.

DETAILED DESCRIPTION OF THE PREFERRED EMBODIMENT

Figure 1:
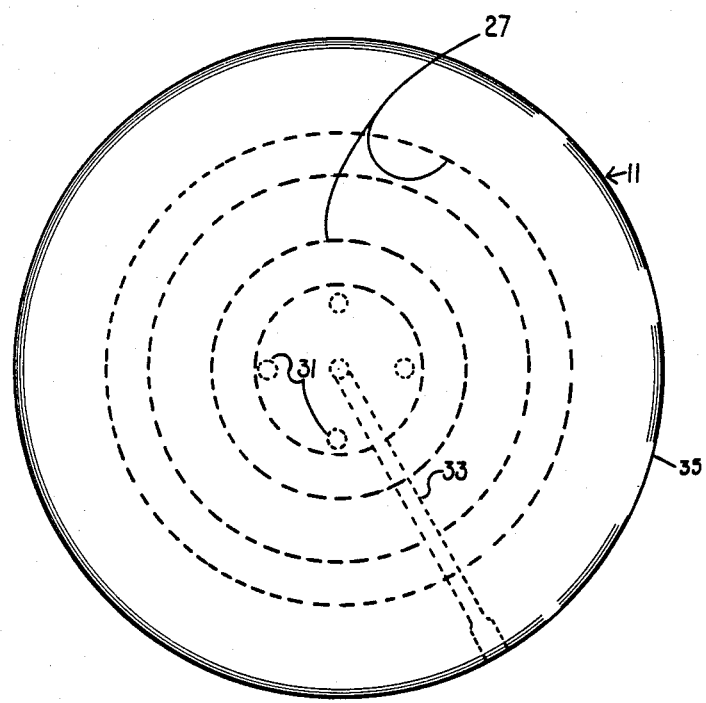
FIG. 1 shows a preferred embodiment of an anode plate according to the invention in a plan view.

Referring to FIG. 1, an anode 11 has a circular face profile and is mounted against an outer wall (not shown) of a vacuum chamber used as a plasma dry etcher, sometimes referred to as a reactor.

Figure 2:
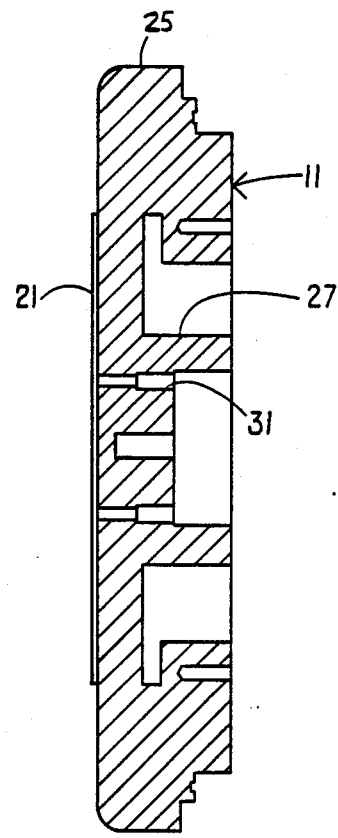
FIG. 2 is a side cross-sectional view, showing cooling passages.

FIG. 2 shows a cross-sectional view of the anode plate 11 of FIG. 1, on which a die wafer 21 is placed. During the plasma etch process, the die wafer 21 functions as the anode. Since the die wafer is exposed to the dry etch chamber, a large portion of the anode plate 11 is shielded by the die wafer 21. A perimeter portion 25 of the anode plate 11 is exposed and presumably functions as an anode in the plasma dry etch chamber. Since the perimeter portion 25 does not need to be processed as a semiconductor, it is desirable that the perimeter portion 25 react as little as possible to plasma.

It turns out that a polymer, usually a fluoropolymer is used on the die wafer 21 during the dry etch process. This fluoropolymer will deposit upon active but cool surfaces such as the perimeter portion 25 of the anode plate 11.

The plasma etch process tends to heat the anode, and thereby supplies heat to perimeter portions of the anode plate 21. The anode plate 11 must be cooled in order to more efficiently perform the plasma dry etch process. This is necessary in order that the silicon wafer 21 be maintained at a desired low temperature so that unwanted physical and chemical processes do not occur on either the silicon wafer, or, more significantly, on photomasks.

The anode plate 11 is provided with cooling passages 27, through which liquid coolant is circulated. Since the most common material from which anode plates are made is aluminum, prior art configurations had merely supplied enough coolant passages to remove the desired amount of heat from the anode plate 11. It has been determined that more even withdrawal of heat from the anode plate 11 will permit the anode plate 11 to be operated at higher temperatures if local hot spots are avoided on the silicon wafer 1. Put another way, the maximum temperature of the anode plate 11 is determined by the maximum local temperature of the silicon wafer 21. Therefore, an even withdrawal of heat from the wafer 21 permits a wafer 21 to be maintained at a higher average temperature, thereby permitting the anode plate 11 to operate at higher temperatures.

The higher temperature operation of the anode plate 11 has two effects: Firstly, by permitting higher temperature operation, more rapid plasma etching can be achieved without causing the wafer 21 to be exposed to excess temperatures. It turns out that more efficient cooling has a second effect, in that the more efficient cooling can be somewhat localized to places where the silicon wafer 21 is pressed against the anode plate 11, while, advantageously, not being efficient at the perimeter area 25.

By configuring the cooling passages 27 so as to withdraw heat from the anode plate 11 near the wafer 2 in preference to withdrawing heat from the perimeter area 25, the perimeter area 25 tends to become elevated in temperature. This elevated temperature at the perimeter area 25 results in less deposit formation, particularly with respect to fluoropolymer which tends to become deposited upon cooler surfaces. In addition to the cooling passages 27, the anode plate 11 is provided with passages 31 through which pins (not shown) pass for lifting the wafer 21, usually subsequent to the etch operation. In order to prevent these passages 31 from causing the wafer 21 to float away from the anode plate 11, a bleed bore 33 extends radially inwardly from the plate's outer perimeter 35 to communicate with pinholes 31. The bleed bore 33 communicates with the vacuum chamber at the plate's outer perimeter 35, so that no special connection or alignment is necessary for the bleed bore 33.

Figure 3:
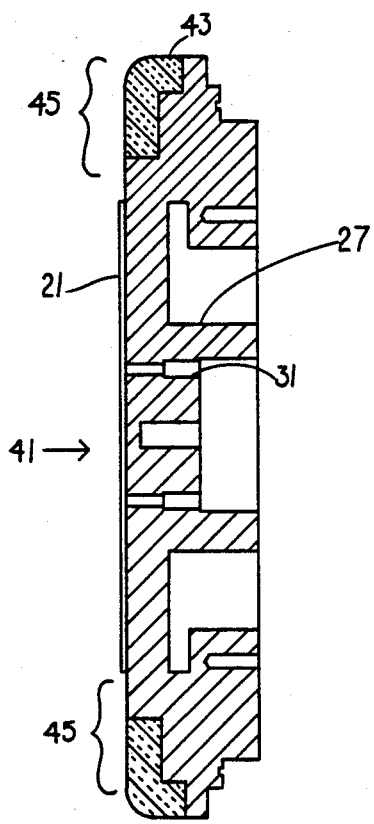
FIG. 3 is a side cross-sectional view of a variation of the anode plate, in which a non-metallic ring is installed at the perimeter.

FIG. 3 shows a configuration in which a modified anode plate 41 has a non-metallic insert 43 at the perimeter portion 45 of the anode plate 41. The non-metallic insert 43 has a lower thermal conductivity in that of the remainder of the anode 41, and therefore may reach a maximum temperature which discourages accumulation of polymer deposits. The non-metallic insert may be made non-conductive, thereby avoiding the anodic activity on that part of the anode plate. It is also possible to form the non-metallic insert 43 of a conductive polymer, thereby permitting the non-metallic insert 43 to function as an anode, and thereby increase in temperature beyond that of the remaining portion of the anode plate 41. In one embodiment, the non-metallic insert 43 is made of ceramic material, such as zirconium oxide. This ceramic material is highly resistive of the effects of elevated temperature and the cooling of the anode plate 41 does not rapidly cool the insert 43. In an alternate environment, the non-metallic insert 43 is made of polytetrafluorethelyne (Teflon TM). The Teflon has an advantage of reducing adhesion of polymer to the insert 43. Other synthetic materials can also be used. If it is desired that the non-metallic insert 43 conduct current in order to provide an anodic function, it is possible to make the non-metallic insert 43 from a conductive polymer.

Figure 4:
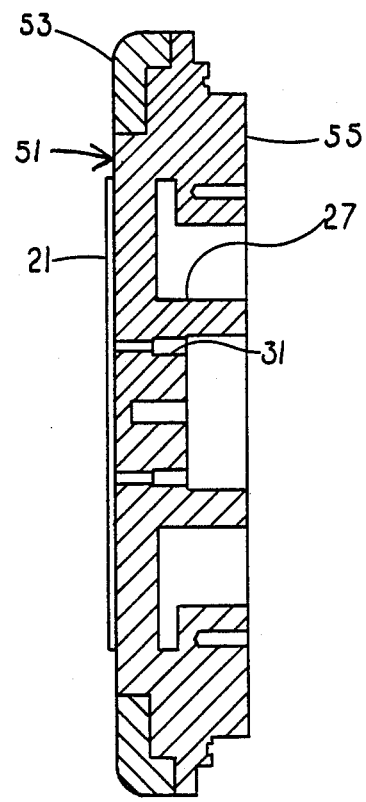
FIG. 4 is a side cross sectional view sharing a configuration in which an anode plate is formed with an outer portion which is separate from an inner core.

FIG. 4 shows a configuration in which an anode plate 51 is formed with an outer portion 53 which is separate from an inner core 55. The inner core 55 includes the cooling passages 27 and supports a semiconductor wafer, such as wafer 21. The outer portion 53 is interference fit or otherwise secured onto the core portion 55 in order that arcing between the outer portion and the core portion 55 is minimized. Because a boundary exists between the core portion 55 and the outer portion 53, thermal conduction from the outer portion 53 to the core portion 55 (with its cooling passages 27) is inhibited. Therefore the outer portion 53 is allowed to achieve elevated temperatures during the operation of the anode plate 51.

Figure 5:
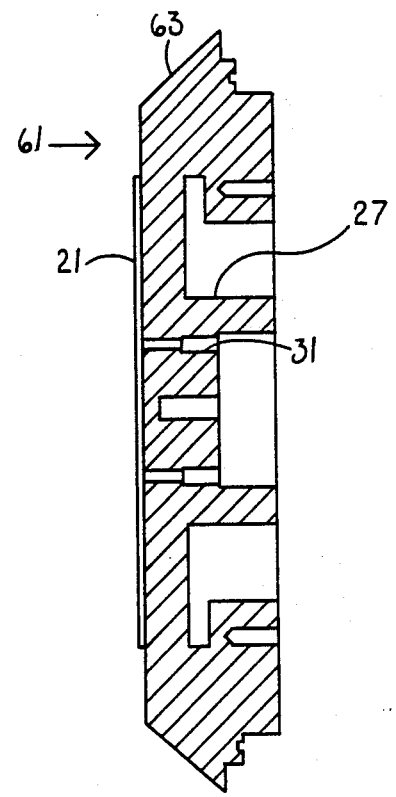
FIG. 5 is a side cross-sectional view of a modified anode plate, in which the anode plate is beveled at its outer perimeter.

FIG. 5 shows a configuration in which an anode plate 61 is provided with a ramped edge 63. The ramped edge permits an increased amount of polymer buildup on the ramped edge 63 without adversely affecting the operation of the anode plate 61. Therefore, the anode plate 61 can be used for a longer period of time as polymer buildup accumulates along the ramped edge 63. As polymer builds up on the ramped edge 63, the outer surface of the ramped edge 63 is less able to conduct heat to the cooling passages 27. Therefore, the accumulation of polymer along the ramped edge 63 decreases, further extending the period of time until polymer buildup exceeds permissible limits.

The above description relates to more specific embodiments of the anode plate. It is possible to further modify the anode plates while remaining within the inventive concepts expressed herein, therefore, the invention should be read as limited only by the appended claims.

We claim:

1. A plasma dry etcher including an anode plate, wherein the anode plate is adapted to support a semiconductor wafer and the anode plate is mounted to the inside of an outer wall of an enclosure in a manner such that the semiconductor wafer faces the inside of the enclosure, comprising:

(a) a plasma dry etch chamber forming the enclosure;
    (b) the anode plate having a body portion and a preferred wafer location; and
    (c) a cooling passage within the anode plate which extends radially outwardly from a cooling core to an extent limited to, and corresponding to, the preferred wafer location so as to preferentially cool the anode plate at the preferred wafer location, wherein the anode plate includes an outer perimeter section which, because the cooling passage extends to said preferred wafer location, has a reduced ability to thermally conduct heat from the outer perimeter, said reduced ability to thermally conduct resulting in the outer section having an elevated temperature as compared to the preferred wafer location, said construction reducing the effects of polymer deposition by minimizing hot spots on the semiconductor wafer when the outer section has said elevated temperature, said construction further permitting the wafer to be maintained at a higher average temperature.

and the outer perimeter of the anode plate includes means for reducing the effects of polymer deposition which occurs during etching of a said substrate 2. Plasma dry etcher as described in claim 1, further comprising:

the anode plate being made of aluminum at said preferred wafer location.

3. Plasma dry etcher as described in claim 1, further comprising:

the anode plate being constructed of two pieces, so that the anode plate includes an outer section which has a reduced ability to thermally conduct to said preferred wafer location and an inner location which includes said preferred wafer location.

4. Plasma dry etcher as described in claim 3, further comprising:

the two pieces being metallic.

5. Plasma dry etcher as described in claim 4, further comprising:

the anode plate being made of aluminum at said preferred wafer location.

6. Plasma dry etcher as described in claim 1, further comprising:

(a) a non? metallic ring provided in a perimeter area of the anode plate, thereby reducing conduction of heat from the perimeter area; and (b) the non-metallic ring being radially separated from said preferred wafer location.

7. Plasma dry etcher as described in claim 6, further comprising:

the non-metallic ring having a reduced affinity toward polymer deposition.

8. Plasma dry etcher as described in claim 1, further comprising:

the non-metallic ring being made of a ceramic material.

9. Plasma dry etcher as described in claim 7, further comprising:

the non-metallic ring being made of polytetrafluorethelyne.

10. Plasma dry etcher as described in claim 1, further comprising:

the cooling passage including a central bore extending about a center hub along concentric boundaries, and a concentric extension, the concentric extension extending radially outwardly from the central bore within the body portion of the anode, the radial extension of the extension being sufficient to permit the concentric extension to have a radius approximating that of the preferred wafer location, the cooling passage thereby preferentially cooling the anode plate at the preferred wafer location, and said preferential cooling at the preferred wafer location resulting in said reduced ability to thermally conduct heat from the outer perimeter.

11. Plasma dry etcher as described in claim 10, further comprising:

the anode plate being made of aluminum at said preferred wafer location.

12. Plasma dry etcher as described in claim 11, further comprising:

the anode plate being constructed of two pieces, so that the anode plate includes an outer section which has a reduced ability to thermally conduct to said preferred wafer location and an inner location which includes said preferred wafer location.

13. Plasma dry etcher as described in claim 12, further comprising:

the two pieces being metal.

14. Plasma dry etcher as described in claim 10, further comprising:

a) a non-metallic ring provided in a perimeter area of the anode plate, thereby reducing conduction of heat from the perimeter area b) the non-metallic ring being radially separated from said preferred wafer location.

15. Plasma dry etcher as described in claim 14, further comprising:

the non-metallic ring having a reduced affinity toward polymer deposition.

* * * * *

UNITED STATES PATENT AND TRADEMARK OFFICE
CERTIFICATE OF CORRECTION

PATENT NO. : 4,859,304
DATED : August 22, 1989
INVENTOR(S) : David A. Cathey, et. al.

It is certified that error appears in the above-indentified patent and that said Letters Patent is hereby corrected as shown below:

Column 2, line 35, delete "sharing a" and insert -- showing --;

Column 3, line 32, delete "2" and insert -- 21 --;

Column 5, line 24, delete "non? metallic" and insert -- non-metallic --;

Column 5, line 34, delete "1" and insert -- 7 --.

Signed and Sealed this

Twenty-first Day of December, 1993

Attest:

BRUCE LEHMAN

*Attesting Officer*  *Commissioner of Patents and Trademarks*